(12) United States Patent  
Arai

(10) Patent No.: US 10,249,331 B2  
(45) Date of Patent: Apr. 2, 2019

(54) METHOD OF MANUFACTURING A WIRING STRUCTURE OF A HEAD SUSPENSION

(71) Applicant: NHK SPRING CO., LTD., Yokohama-shi, Kanagawa (JP)

(72) Inventor: Hajime Arai, Kanagawa (JP)

(73) Assignee: NHK SPRING CO., LTD., Kanagawa (JP)

( * ) Notice: Subject to any disclaimer, the term of this patent is extended or adjusted under 35 U.S.C. 154(b) by 173 days.

(21) Appl. No.: 15/234,670

(22) Filed: Aug. 11, 2016

(65) Prior Publication Data

US 2016/0351216 A1  Dec. 1, 2016

Related U.S. Application Data

(62) Division of application No. 13/660,477, filed on Oct. 25, 2012, now Pat. No. 9,454,982.

(30) Foreign Application Priority Data

Nov. 2, 2011 (JP) ................................ 2011-241693

(51) Int. Cl.
*G11B 5/127* (2006.01)
*H04R 31/00* (2006.01)
(Continued)

(52) U.S. Cl.
CPC .......... *G11B 5/4846* (2013.01); *G11B 5/1272* (2013.01); *G11B 5/486* (2013.01); *G11B 5/4826* (2013.01); *H05K 1/0245* (2013.01); *H05K 1/0277* (2013.01); *H05K 1/0298* (2013.01); *H05K 1/18* (2013.01); *H05K 1/189* (2013.01); *H05K 3/0011* (2013.01); *H05K 3/18* (2013.01); *G11B 5/484* (2013.01); *H05K 1/056* (2013.01);
(Continued)

(58) Field of Classification Search
CPC .. H05K 1/0245; H05K 1/0277; H05K 1/0298; H05K 1/056; H05K 1/18; H05K 1/189; H05K 3/0011; H05K 3/18; G11B 5/1272; G11B 5/4826; G11B 5/484; G11B 5/4846; G11B 5/486
See application file for complete search history.

(56) References Cited

U.S. PATENT DOCUMENTS 5,812,344 A 9/1998 Balakrishnan
7,652,890 B2 * 1/2010 Ohsawa ................. G11B 5/486  
174/254

(Continued)

FOREIGN PATENT DOCUMENTS

JP 10-124837 A 5/1998
JP 11-53726 A 2/1999
(Continued)

*Primary Examiner* — Paul D Kim  
(74) *Attorney, Agent, or Firm* — Norris McLaughlin, P.A.

(57) ABSTRACT

A wiring structure of a head suspension including a flexure that supports a head and is attached to a load beam applying load onto the head, comprises write wiring and read wiring formed on the flexure and connected to the head, each having wires of opposite polarities, and further including a stacked interleaved part includes segments electrically connected to the respective wires of the write wiring, the segments stacked on and facing the wires through an electrical insulating layer so that the facing wire and segment have opposite polarities.

2 Claims, 15 Drawing Sheets

(51) Int. Cl.
  *G11B 5/48* (2006.01)
  *H05K 1/18* (2006.01)
  *H05K 1/02* (2006.01)
  *H05K 3/00* (2006.01)
  *H05K 3/18* (2006.01)
  *H05K 1/05* (2006.01)

(52) U.S. Cl.
  CPC ... *H05K 2201/05* (2013.01); *H05K 2201/097* (2013.01); *H05K 2201/09245* (2013.01); *H05K 2201/2009* (2013.01); *Y10T 29/49194* (2015.01)

(56) References Cited

U.S. PATENT DOCUMENTS

| | | |
|---|---|---|
| 8,310,789 B2 | 11/2012 | Contreras et al. |
| 8,598,460 B2 | 12/2013 | Contreras et al. |
| 8,675,311 B2 | 3/2014 | Contreras et al. |
| 2010/0226045 A1 | 9/2010 | Yamada et al. |
| 2010/0290160 A1 | 11/2010 | Arai |
| 2011/0149442 A1 | 6/2011 | Contreras et al. |
| 2012/0162825 A1 | 6/2012 | Contreras et al. |

FOREIGN PATENT DOCUMENTS

| | | |
|---|---|---|
| JP | 2010-211835 A | 9/2010 |
| JP | 2010-267334 A | 11/2010 |
| JP | 2012-133869 A | 7/2012 |

* cited by examiner

FIG.4A S1 FORM WIRES ON BASE INSULATING LAYER
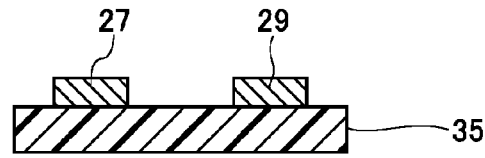
FIG.4B S2 FORM INTERMEDIATE INSULATING LAYER AND CONDUCTORS
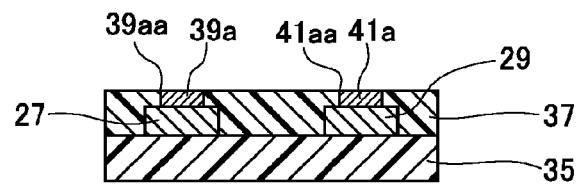
FIG.4C S3 FORM STACKED INTERLEAVED PART
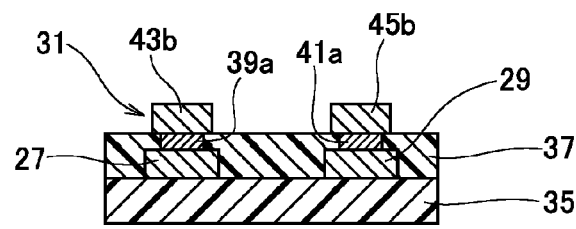
FIG.4D S4 FORM COVER INSULATING LAYER
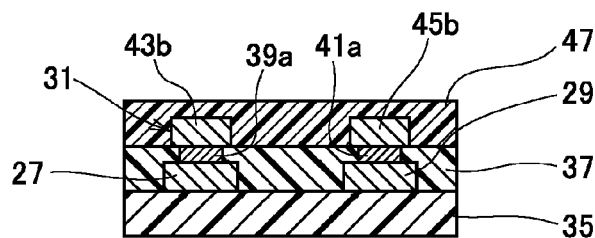

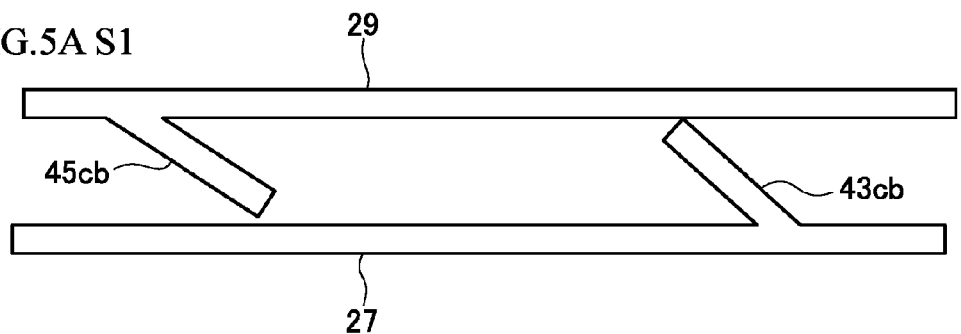
FIG.5A S1
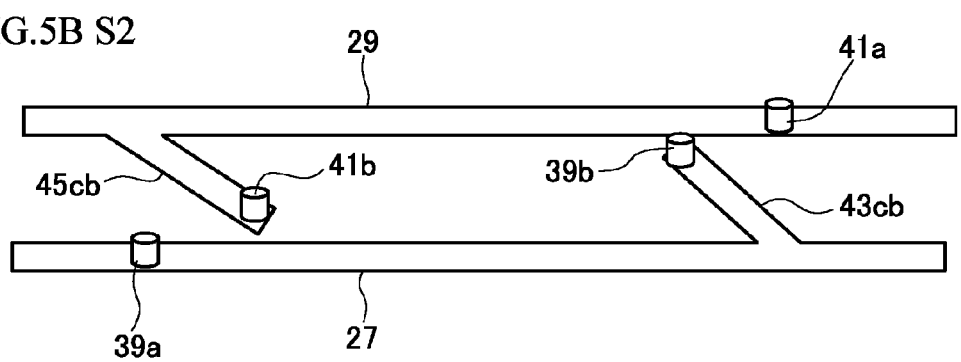
FIG.5B S2
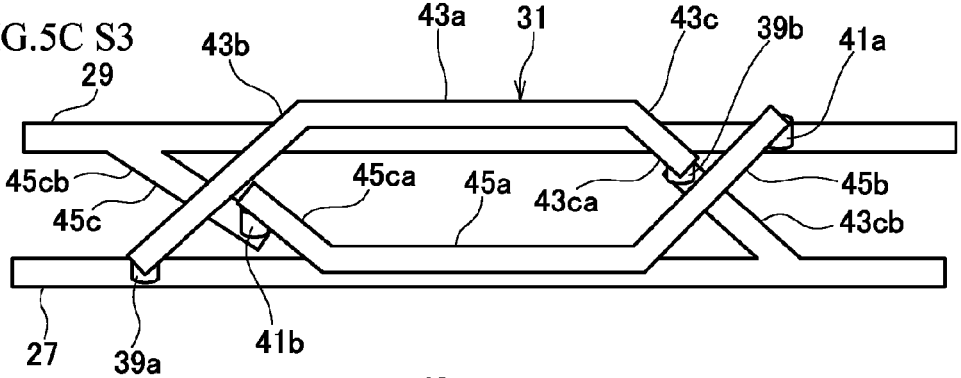
FIG.5C S3
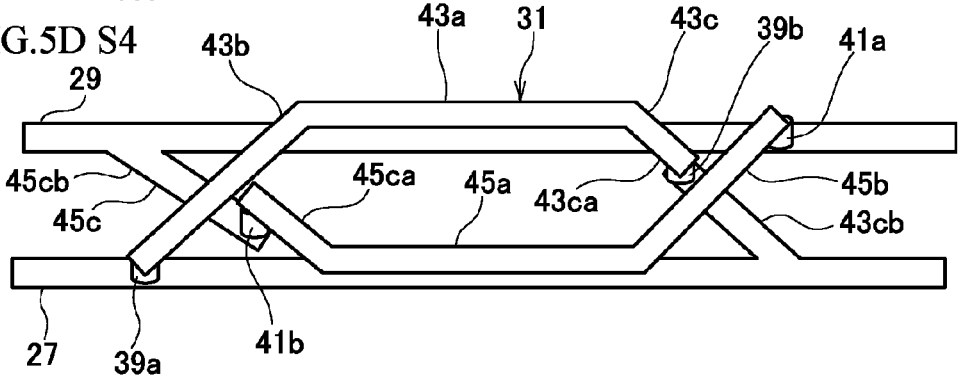
FIG.5D S4

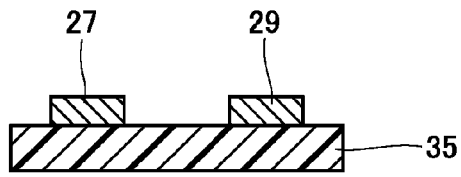
FIG.6A S11
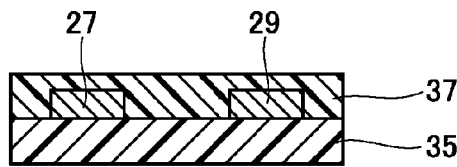
FIG.6B S12
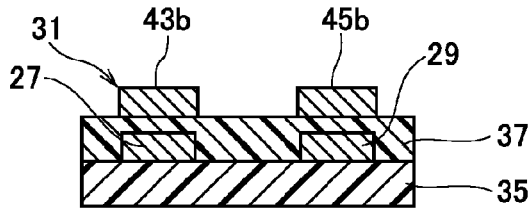
FIG.6C S13
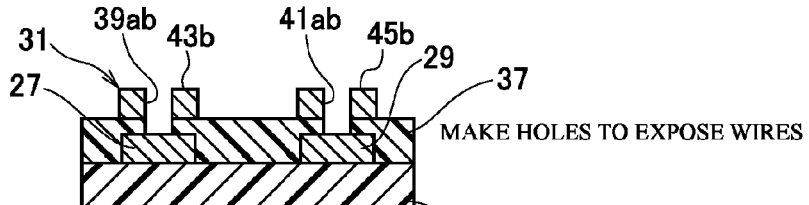
FIG.6D S14    MAKE HOLES TO EXPOSE WIRES
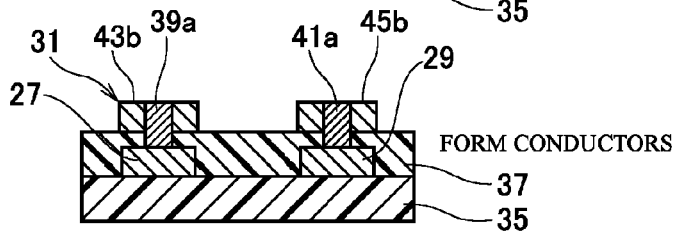
FIG.6E S15    FORM CONDUCTORS
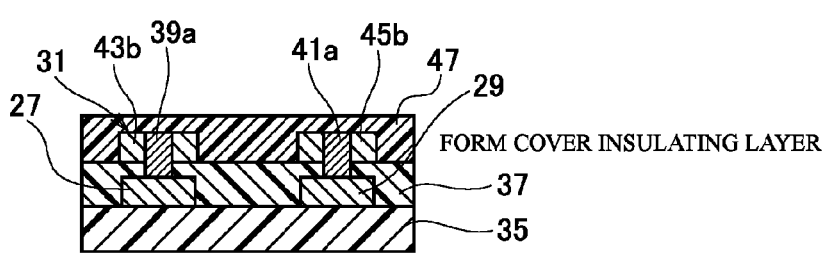
FIG.6F S16    FORM COVER INSULATING LAYER

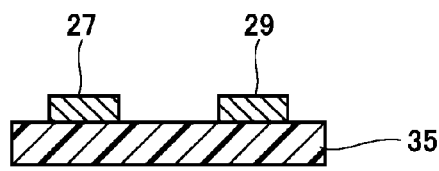
FIG.7A S21
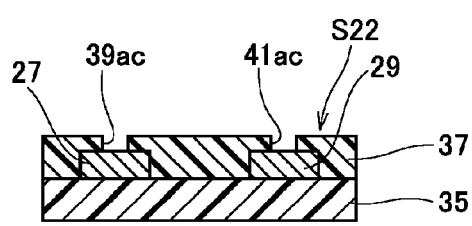
FIG.7B S22
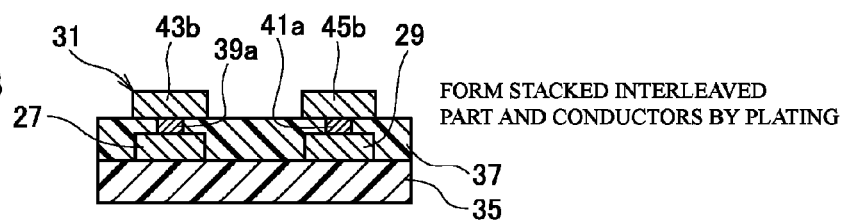
FIG.7C S23    FORM STACKED INTERLEAVED PART AND CONDUCTORS BY PLATING
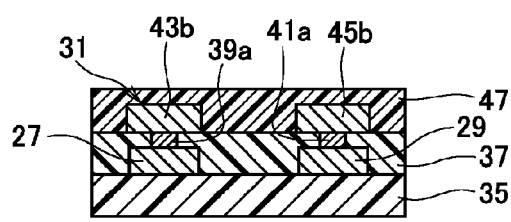
FIG.7D S24

NO WINDOW

WINDOW RATIO OF 50%

WINDOW RATIO OF 100%

FIG.21A S31
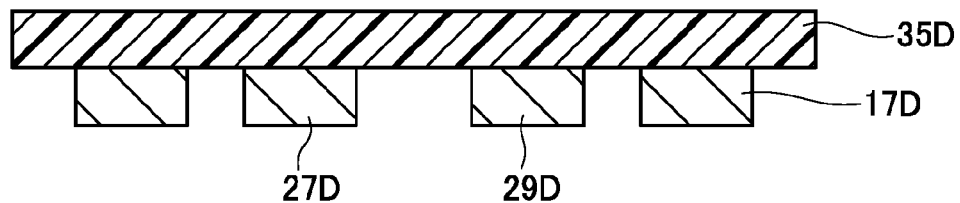
FIG.21B S32
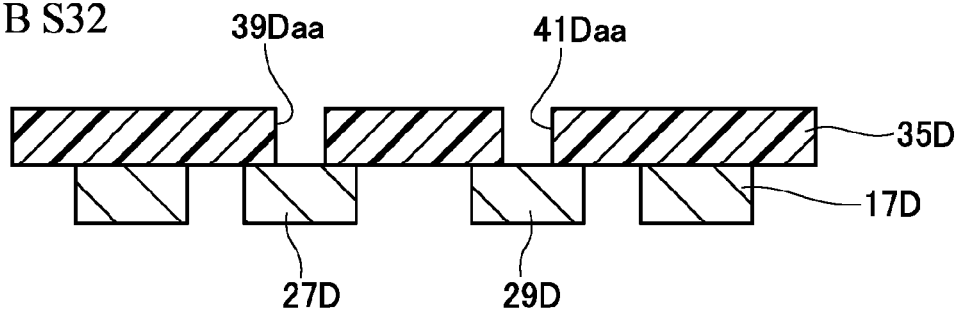
FIG.21C S33
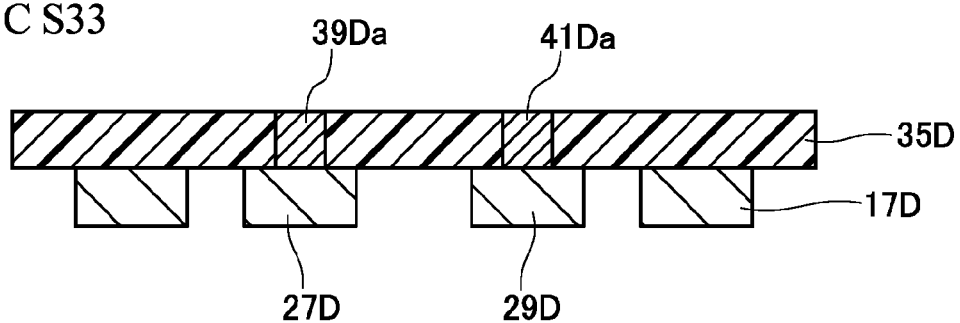
FIG.21D S34
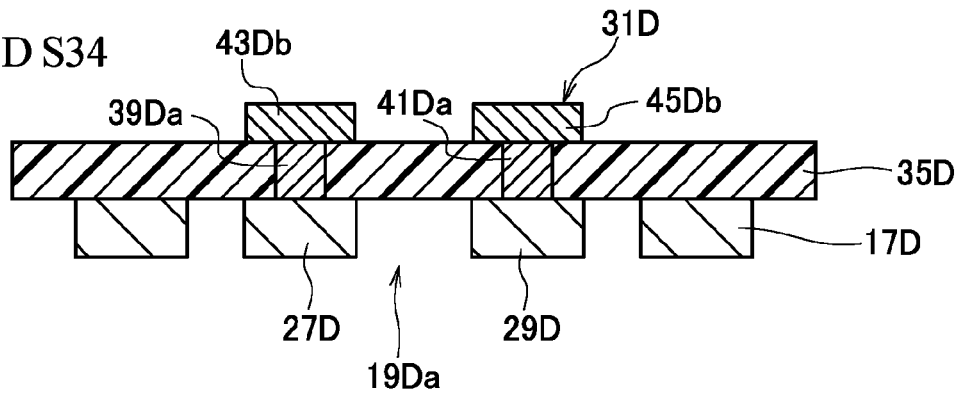

US 10,249,331 B2

METHOD OF MANUFACTURING A WIRING STRUCTURE OF A HEAD SUSPENSION

REFERENCE TO RELATED APPLICATION

This is a divisional application of Ser. No. 13/660,477, filed Oct. 25, 2012, now U.S. Pat. No. 9,454,982, which is currently allowed. The subject matter of the aforementioned prior application is hereby incorporated herein by reference.

BACKGROUND OF THE INVENTION

1. Field of the Invention

The present invention relates to a wiring structure of a head suspension and a method of manufacturing the wiring structure, the head suspension installed in a hard disk drive of an information processor such as computer.

2. Description of Related Art

Recent hard disk drives are required to have large capacity and high transfer rate and operate at low power consumption.

To satisfy these requirements, in particular, to realize high-speed data transfer, the head suspension must be capable of handling a broad bandwidth. In connection with this, Japanese Unexamined Patent Application Publication No. H10-124837 discloses an interleaved wiring structure. FIGS. 22 and 23 illustrate write wiring 101 to which the interleaved wiring structure is applied. The write wiring 101 is formed on a base insulating layer and includes first-polarity wires 101*aa* and 101*ab* and second-polarity wires 101*ba* and 101*bb* that are horizontally interleaved and have the same width. First ends of the first-polarity wires 101*aa* and 101*ab* are connected to each other through a bypass wire 101*c* and first ends of the second-polarity wires 101*ba* and 101*bb* are connected to each other through a bypass wire 101*d*. Second ends of the first-polarity wires 101*aa* and 101*ab* are connected to each other through a bridge 101*e* and second ends of the second-polarity wires 101*ba* and 101*bb* are connected to each other through a bridge 101*f*.

The interleaved wiring structure according to the related art interleaves the first- and second-polarity wires 101*aa*, 101*ab*, 101*ba*, and 101*bb* on the same plane, to extremely widen an overall width of the interleaved wiring structure and limit the degree of freedom of designing the head suspension.

SUMMARY OF THE INVENTION

An object of the present invention is to provide a wiring structure of a head suspension, capable of employing an interleaved wiring configuration while preventing the increase of an overall width of the wiring structure, thereby improving the degree of freedom of designing the head suspension.

In order to accomplish the object, an aspect of the present invention provides a wiring structure of a head suspension, including a flexure that supports a head used to write and read data to and from a recording medium and is attached to a load beam applying load onto the head. The wiring structure includes write wiring and read wiring formed on the flexure and connected to the head, each having wires of opposite polarities. The wiring structure further includes a stacked interleaved part provided at least for the write wiring, the stacked interleaved part including segments electrically connected to the respective wires of the write wiring at both ends in each segment. The segments are stacked on and face the wires of the write wiring through an electrical insulating layer so that the facing wire and segment have opposite polarities to interleave at least the write wiring at the stacked interleaved part.

This aspect of the present invention realizes the interleaved wiring configuration at the stacked interleaved part, to prevent the increase of an overall wiring width and secure the degree of freedom of designing the head suspension.

Another aspect of the present invention provides a method of manufacturing the wiring structure of the above-mentioned aspect. The method includes a wiring step of forming the first- and second-polarity wires, an insulating layer forming step of forming the electrical insulating layer on the wires and forming conductors on the wires so that the conductors pass through the electrical insulating layer and are exposed from the surface of the electrical insulating layer, and a stacked interleaved part forming step of forming the stacked interleaved part on the electrical insulating layer and electrically connecting the stacked interleaved part to the conductors.

This aspect of the present invention properly forms the interleaved wiring structure with the stacked interleaved part.

BRIEF DESCRIPTION OF THE DRAWINGS

FIGS. 4A to 4D are sectional views illustrating a method of manufacturing the wiring structure of FIG. 2, in which FIG. 4A is a wiring step, FIG. 4B is an insulating layer forming step, FIG. 4C is a stacked interleaved part forming step, and FIG. 4D is a cover insulating layer forming step;

FIGS. 5A to 5D are perspective views corresponding to FIGS. 4A to 4D, illustrating only wiring at the stacked interleaved part;

FIGS. 6A to 6F are sectional views illustrating a modification of the method of FIGS. 4A to 4D, in which FIG. 6A is a wiring step, FIG. 6B is an insulating layer forming step, FIGS. 6C to 6E are a stacked interleaved part forming step, and FIG. 6F is a cover insulating layer forming step;

FIGS. 7A to 7D are sectional views illustrating another modification of the method of FIGS. 4A to 4D, in which FIG. 7A is a wiring step, FIG. 7B is an insulating layer forming step, FIG. 7C is a stacked interleaved part forming step, and FIG. 7D is a cover insulating layer forming step;

FIGS. 8A and 8B are graphs illustrating a relationship between a transmission loss and a frequency of the wiring structure according to the first embodiment, in which FIG. 8A is a general graph and FIG. 8B is an enlarged partial graph of the graph of FIG. 8A;

FIGS. 15A to 15C are perspective views illustrating the presence or absence of a window provided for the wiring structure according to the first embodiment of the present invention, in which FIG. 15A is with no window, FIG. 15B is with a window of 50% in window ratio, and FIG. 15C is with a window of 100% in window ratio;

FIGS. 21A to 21D are sectional views illustrating a method of manufacturing the wiring structure of FIG. 20, in which FIGS. 21A to 21C are a wiring step and FIG. 21D is a stacked interleaved part forming step;

DETAILED DESCRIPTION OF EMBODIMENTS

Embodiments of the present invention will be explained. Each embodiment realizes a stacked and interleaved wiring structure of a head suspension while preventing the increase of the width of the wiring, thereby securing the degree of freedom of designing the head suspension.

A first embodiment of the present invention will be explained in detail with reference to the drawings.

Figure 1:
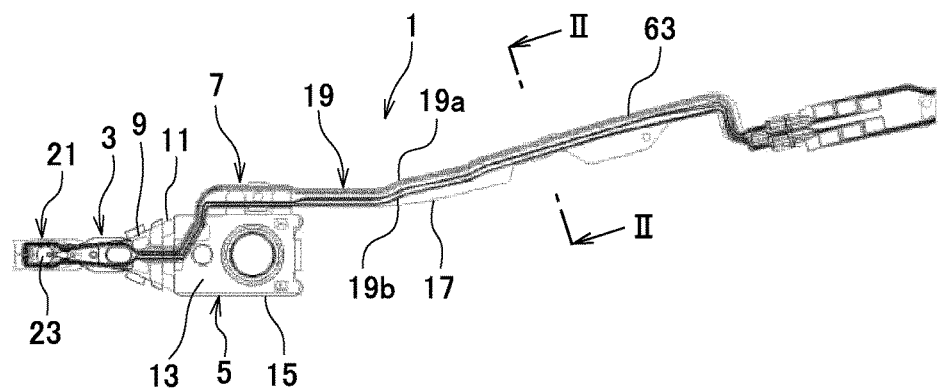
FIG. 1 is a plan view illustrating a head suspension employing a wiring structure according to a first embodiment of the present invention.

FIG. 1 is a plan view illustrating a head suspension employing a wiring structure according to the first embodiment of the present invention.

In FIG. 1, the head suspension 1 includes a load beam 3, a base 5, and a flexure 7. The load beam 3 applies load onto a head 21 that is used to write and read data to and from a recording medium. The load beam 3 has a rigid part 9 and a resilient part 11. The rigid part 9 is made of, for example, a thin stainless steel plate having a thickness of, for example, about 100 micrometers.

The resilient part 11 is discrete from the rigid part 9 and is made of, for example, a resilient thin stainless steel rolled plate. A spring constant of the resilient part 11 is lower than that of the rigid part and is precise. The thickness of the resilient part 11 is, for example, about 40 micrometers. A first end of the resilient part 11 is fixed to a rear end of the rigid part 9 by, for example, laser welding. A second end of the resilient part 11 is integral with a reinforcing plate 13.

The base 5 has a base plate 15 that is laid on and fixed to the reinforcing plate 13 by, for example, laser welding.

The reinforcing plate 13 reinforces the base plate 15, thereby forming the base 5. The base 5 is attached to an arm of a carriage that is driven around a spindle.

The flexure 7 includes a base material 17 that is made of a conductive thin plate such as a resilient thin stainless steel rolled plate (SST) having a thickness of about 15 to 30 micrometers. On the base material 17, a wiring pattern 19 is formed through a base insulating layer 35 to be explained later.

The wiring pattern 19 includes write wiring 19a and read wiring 19b. Each of the write wiring 19a and read wiring 19b includes a first-polarity wire and a second-polarity wire that are wires having opposite polarities. Namely, the first polarity is one of the positive polarity and negative polarity and the second polarity is the other thereof. The wires of the write wiring 19a and read wiring 19b are sometimes referred to as "traces". According to the first embodiment, the write wiring 19a is provided with a stacked interleaved part 31.

The flexure 7 is fixed to the rigid part 9 of the load beam 3 by, for example, laser welding. A first end of the wiring pattern 19 is electrically connected to the head 21 and a second end of the wiring pattern 19 extends outside the base 5. Namely, the write and read wirings 19a and 19b are formed on the flexure 7 and connected to the head 21, each having wires of opposite polarities.

The flexure 7 has a cantilever tongue 23 that supports a slider for the head 21.

The head 21 has a write element such as an inductive magnetic transducer and a read element such as an MR element, a GMR element, or a TuMR element to improve a read sensitivity.

The stacked structure of the flexure 7 with the stacked interleaved part 31 of the wiring structure according to the first embodiment will be explained in detail.

Figure 2:
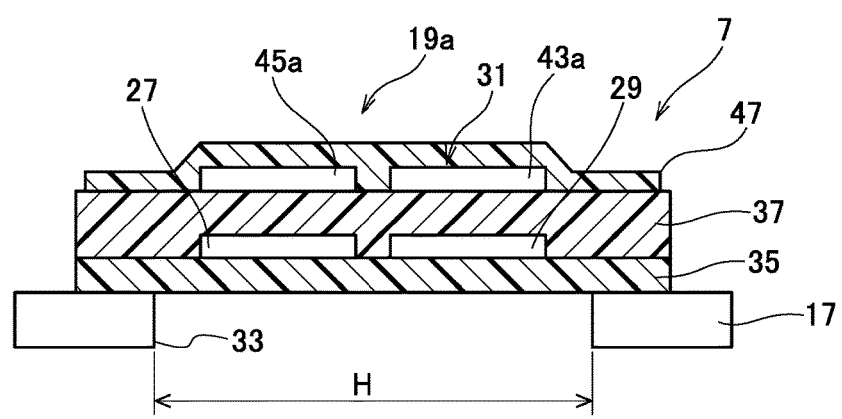
FIG. 2 is a sectional view taken along a line II-II of FIG. 1, illustrating a stacked interleaved part provided for write wiring of the head suspension according to the first embodiment.
Figure 3:
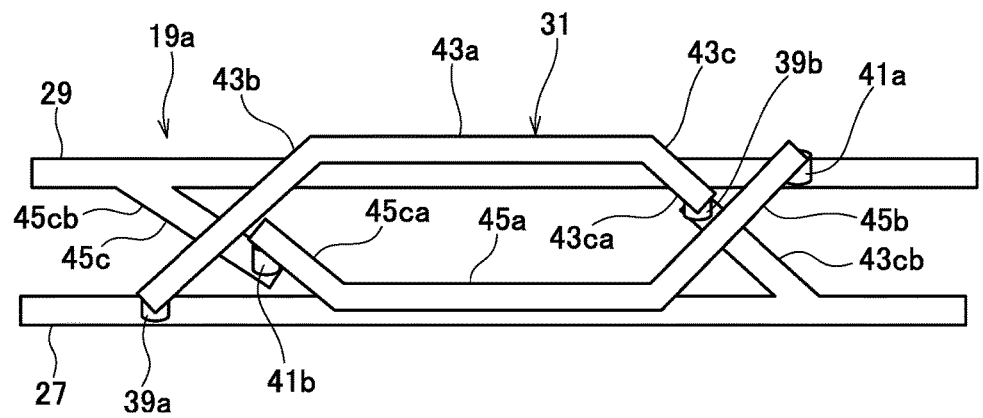
FIG. 3 is a perspective view schematically illustrating the stacked interleaved part of FIG. 2.

FIG. 2 is a sectional view taken along a line II-II of FIG. 1, illustrating the stacked structure with the stacked interleaved part 31 and FIG. 3 is a perspective view schematically illustrating the stacked structure with the stacked interleaved part 31.

In the wiring structure of the head suspension 1, the write wiring 19a of the flexure 7 has, on the base material 17, a first-polarity wire (trace) 27, a second-polarity wire (trace) 29 having a polarity opposite to the first-polarity wire 27, and the stacked interleaved part 31 as the stacked structure.

The base material 17 has a window 33 formed through the base material 17. The window 33 has a width H and a length L (FIG. 15) and is formed to increase an impedance and widen a bandwidth. The width H of the window 33 is set to be larger than a width of the write wiring 19a and the length L thereof is set to correspond to the stacked interleaved part 31. Namely, the window 33 is formed at a location corresponding to the stacked interleaved part 31. An open ratio, or a window ratio of the window 33 with respect to the stacked interleaved part 31 is adjustable to adjust an impedance, a bandwidth, and a transmission loss dip to be explained later. According to the first embodiment, the open ratio (window ratio) of the window 33 with respect to the stacked interleaved part 31 is 100% (FIG. 15).

On the base material 17, the base insulating layer 35 is formed. The base insulating layer 35 is an electrical insulating layer that is made of flexible insulating resin such as polyimide and has a thickness of about 5 to 20 micrometers. On the base insulating layer 35, the wires 27 and 29 having opposite polarities are formed.

On the base insulating layer 35, an intermediate insulating layer 37 is an electrical insulating layer formed from flexible insulating resin such as polyimide. On the intermediate insulating layer 37, the stacked interleaved part 31 is formed. In FIG. 2, a wiring width of the stacked interleaved part 31 is equal to a wiring width of the wires 27 and 29 having opposite polarities. Ends of the stacked interleaved part 31 are connected to the wires 27 and 29. The stacked interleaved part 31 includes facing sections 43a and 45a that are alternated with respect to the wires 27 and 29 so that the facing section 43a (45a) and the wire 29 (27) facing each other have opposite polarities.

Connection between the ends of the stacked interleaved part 31 and the wires 27 and 29 is carried out with conductors 39a, 39b, 41a, and 41b that are formed through the intermediate insulating layer 37.

The stacked interleaved part 31 includes the facing sections 43a and 45a and crossing sections 43b, 43c, 45b, and 45c. The facing section 43a and a pair of crossing sections 43b and 43c form a first-polarity segment electrically connected to the first-polarity wire 27. The facing section 45a and a pair of crossing sections 45b and 45c form a second-polarity segment electrically connected to the second-polarity wire 29. Namely, the stacked interleaved part 31 includes the segments electrically connected to the respective wires 27 and 29 of the write wiring 19a at both ends in each segment.

The facing section 43a of the first polarity is stacked on and faces the wire 29 of the second polarity of the opposite polarity with the intermediate insulating layer 37 interposed between them. The facing section 45a of the second polarity is stacked on and faces the wire 27 of the first polarity of the opposite polarity with the intermediate insulating layer 37 interposed between them. The crossing sections 43b and 43c of the first polarity extend between both ends of the facing section 43a and the wire 27 of the same polarity. The crossing sections 45b and 45c of the second polarity extend between ends of the facing section 45a and the wire 29 of the same polarity. Namely, the crossing sections 43b and 43c (45b and 45c) are arranged at respective ends of the facing section 43a (45a). The crossing sections 43b and 45c of opposite polarities cross each other and the crossing sections 43c and 45b of opposite polarities cross each other.

In this way, the segments are stacked on and facing wires 27 and 29 through the intermediate insulating layer 37 so that the facing wire 27 (29) and segment have opposite polarities to interleave the write wiring 19a at the stacked interleaved part 31.

The crossing configuration of the stacked interleaved part 31 is adjustable as and when required.

The crossing section 43b is electrically connected to the wire 27 through the conductor 39a and the crossing section 45b is electrically connected to the wire 29 through the conductor 41a.

The crossing section 43c has a facing-side arm 43ca and a wire-side arm 43cb and the crossing section 45c has a facing-side arm 45ca and a wire-side arm 45cb. The facing-side arm 43ca is integral with the facing section 43a formed on the intermediate insulating layer 37 and the facing side arm 45ca is integral with the facing section 45a formed on the intermediate insulating layer 37. The wire-side arm 43cb is integral with the wire 27 formed on the base insulating layer 35 and the wire-side arm 45cb is integral with the wire 29 formed on the base insulating layer 35.

Ends of the facing-side arm 43ca and wire-side arm 43cb are electrically connected to each other through the conductor 39b. Ends of the facing-side arm 45ca and wire-side arm 45cb are electrically connected to each other through the conductor 41b. As a result, the crossing sections 43b and 45c cross each other and the crossing sections 43c and 45b cross each other.

The intermediate insulating layer 37 is covered with a cover insulating layer 47 that is an electrical insulating layer made of flexible insulating resin such as polyimide. The thickness of the cover insulating layer 47 is about 1 to 20 micrometers. The cover insulating layer 47 covers the surface of the stacked interleaved part 31, thereby protecting the same from external force.

A method of manufacturing the wiring structure according to the first embodiment will be explained with reference to FIGS. 4A to 4D and 5A to 5D in which FIG. 4A is a wiring step, FIG. 4B is an insulating layer forming step, FIG. 4C is a stacked interleaved part forming step, FIG. 4D is a cover insulating layer forming step, and FIGS. 5A to 5D are perspective views illustrating only wirings corresponding to FIGS. 4A to 4D.

In FIGS. 4A and 5A, the wiring step S1 forms the wires (traces) 27 and 29 on the base insulating layer 35 by, for example, copper plating. At this time, the wire-side arms 43cb and 45cb are integrally formed with the wires 27 and 29, respectively.

In FIGS. 4B and 5B, the insulating layer forming step S2 forms the intermediate insulating layer 37 on the base insulating layer 35 having the wires 27 and 29. With this, the insulating layer 37 is formed on the wires 27 and 29. As well as the insulating layer 37, the conductors 39a, 39b, 41a, and 41b in holes 39aa, 41aa, and the like are formed by copper plating. Although FIG. 4B illustrates only the holes 39aa and 41aa for the conductors 39a and 41a, holes for the conductors 39b and 41b are also formed. These holes are formed through the intermediate insulating layer 37. The conductors 39a, 41a, 39b, and 41b are formed on the wires 27 and 29 and wire-side arms 43cb and 45cb, respectively, so that the conductors pass through the intermediate insulating layer 37 and are exposed from the surface of the intermediate insulating layer 37. According to the embodiment, the conductors are exposed to be substantially flush with the surface of the intermediate insulating layer 37.

In FIGS. 4C and 5C, the stacked interleaved part forming step S3 forms, on the intermediate insulating layer 37, the stacked interleaved part 31 and electrically connects the stacked interleaved part 31 to the conductors. Namely, the step S3 forms the facing sections 43a and 45a, crossing sections 43b and 45b, and facing-side arms 43ca and 45ca by, for example, copper plating on the intermediate insulating layer 37. The crossing sections 43b and 45b are connected to the conductors 39a and 41a on the wires 27 and 29, respectively. The facing-side arms 43ca and 45ca are connected to the conductors 39b and 41b on the wire-side arms 43cb and 45cb, respectively.

FIG. 4C illustrates connection between the crossing sections 43b and 45b and the conductors 39a and 41a, and therefore, positionally differs from FIG. 2 that illustrates the wires 27 and 29 and facing sections 43a and 45a at a location where no conductor is present.

In FIGS. 4D and 5D, the cover insulating layer forming step S4 forms the cover insulating layer 47 on the intermediate insulating layer 37, thereby covering the surface of the stacked interleaved part 31.

A modification of the method illustrated in FIGS. 4A to 4D and 5A to 5D will be explained with reference to FIGS.

6A to 6F in which FIG. 6A is a wiring step, FIG. 6B is an insulating layer forming step, FIGS. 6C to 6E are a stacked interleaved part forming step, and FIG. 6F is a cover insulating layer forming step.

The wiring step S11 of FIG. 6A, the insulating layer forming step S12 of FIG. 6B, the stacked interleaved part forming steps S13 to S15 of FIGS. 6C to 6E, and the cover insulating layer forming step S16 of FIG. 6F correspond to the wiring step S1 of FIG. 4A, the insulating layer forming step S2 of FIG. 4B, the stacked interleaved part forming step S3 of FIG. 4C, and the cover insulating layer forming step S4 of FIG. 4D, respectively. The wiring step S11 and cover insulating layer forming step S16 are substantially the same as the wiring step S1 and cover insulating layer forming step S4.

In FIG. 6B, the insulating layer forming step S12 forms no holes. In FIG. 6D, the step S14 forms holes 39ab, 41ab, and the like that pass through the stacked interleaved part 31 and the electrical insulating layer, i.e., the crossing sections 43b and 45b, facing-side arms 43ca and 45ca, and intermediate insulating layer 37 and reach the wires 27 and 29 and wire-side arms 43cb and 45cb. Although FIG. 6D illustrates only the holes for the conductors 39a and 41a, holes for the conductors 39b and 41b are also formed. In FIG. 6E, the step S15 forms the conductors 39a, 41a, 39b, and 41b in the holes 39ab, 41ab, and the like by, for example, copper plating like FIG. 5.

Another modification of the method illustrated in FIGS. 4A to 4D and 5A to 5D will be explained with reference to FIGS. 7A to 7D in which FIG. 7A is a wiring step, FIG. 7B is an insulating layer forming step, FIG. 7C is a stacked interleaved part forming step, and FIG. 7D is a cover insulating layer forming step.

The wiring step S21 of FIG. 7A, the insulating layer forming step S22 of FIG. 7B, the stacked interleaved part forming step S23 of FIG. 7C, and the cover insulating layer forming step S24 of FIG. 7D correspond to the wiring step S1 of FIG. 4A, the insulating layer forming step S2 of FIG. 4B, the stacked interleaved part forming step S3 of FIG. 4C, and the cover insulating layer forming step S4 of FIG. 4D, respectively. The wiring step S21 and cover insulating layer forming step S24 are substantially the same as the wiring step S1 and cover insulating layer forming step S4.

In FIG. 7B, the insulating layer forming step S22 forms holes 39ac, 41ac, and the like through the intermediate insulating layer 37 on the wires 27 and 29. Although FIG. 7B illustrates only the holes for the conductors 39a and 41a, holes for the conductors 39b and 41b are also formed. In FIG. 7C, the step S23 forms, in the holes, the conductors 39a, 39b, 41a, and 41b together with the stacked interleaved part 31 (in particular, the segments thereof) by, for example, copper plating like FIG. 5.

Namely, the step S23 forms, on the intermediate insulating layer 37, the facing sections 43a and 45a, crossing sections 43b and 45b, and facing-side arms 43ca and 45ca by copper plating. At this time, the conductors 39a, 41a, 39b, and 41b are formed in the holes 39ac, 41ac, and the like. Therefore, the step S23 electrically connects the stacked interleaved part 31 to the wires 27 and 29.

Effects of the first embodiment of the present invention will be explained.

The wiring structure of the head suspension 1 according to the first embodiment including the flexure 7 that supports a head 21 used to write and read data to and from a recording medium and is attached to the load beam 3 applying load onto the head 21.

The wiring structure has the write wiring 19a and read wiring 19b formed on the flexure 7 and electrically connected to the head 21, each wiring having the wires of opposite polarities.

The flexure 7 has the conductive thin base material 17, the base insulating layer 35 formed on the base material 17, and the write wiring 19a and read wiring 19b formed on the base insulating layer 35. The write wiring 19a is provided with the stacked interleaved part 31. The stacked interleaved part 31 includes the facing sections 43a and 45a that are formed on the intermediate insulating layer 37 that is formed on the base insulating layer 35. The facing sections 43a and 45b are the segments electrically connected to the respective wires 27 and 29 at both ends in each segment. The facing sections 43a and 45b are stacked on and face the wires 29 and 27 through the intermediate insulating layer 37 so that the wire and facing section facing each other have opposite polarities to interleave the write wiring 19 at the stacked interleaved part 31.

Accordingly, the wiring structure forms the interleaved wiring configuration by stacking the interleaved part 31 to prevent the increase of the overall wiring width of the write wiring 19a, thereby securing the degree of freedom of designing the head suspension 1.

The method of manufacturing the wiring structure of the head suspension 1 according to the first embodiment includes, as illustrated in FIGS. 4A to 4D and 5A to 5D, the wiring step S1 of forming the wires 27 and 29 integral with the wire-side arms 43cb and 45cb, the insulating layer forming step S2 of forming the intermediate insulating layer 37 on the wires 27 and 29, as well as the conductors 39a, 41a, 39b, and 41b on the wires 27 and 29 and wire-side arms 43cb and 45cb so that the conductors 39a, 41a, 39b, and 41b pass through the intermediate insulating layer 37 and are exposed from the surface of the intermediate insulating layer 37, the stacked interleaved part forming step S3 of forming the stacked interleaved part 31, i.e., the facing sections 43a and 45a, crossing sections 43b and 45b, and facing-side arms 43ca and 45ca on the intermediate insulating layer 37, so that the crossing sections 43b and 45b are connected to the conductors 39a and 41a on the wires 27 and 29 and the facing-side arms 43ca and 45ca are connected to the conductors 39b and 41b on the wire-side arms 43cb and 45cb, and the cover insulating layer forming step S4 of forming the cover insulating layer 47 over the intermediate insulating layer 37.

This method properly forms the stacked interleaved part 31.

Figure 8A:
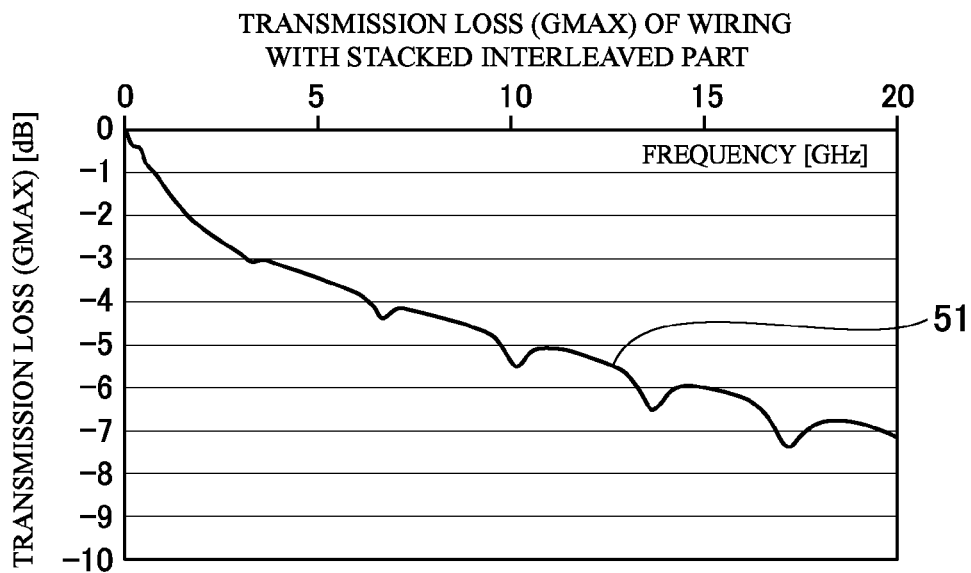
Figure 8B:
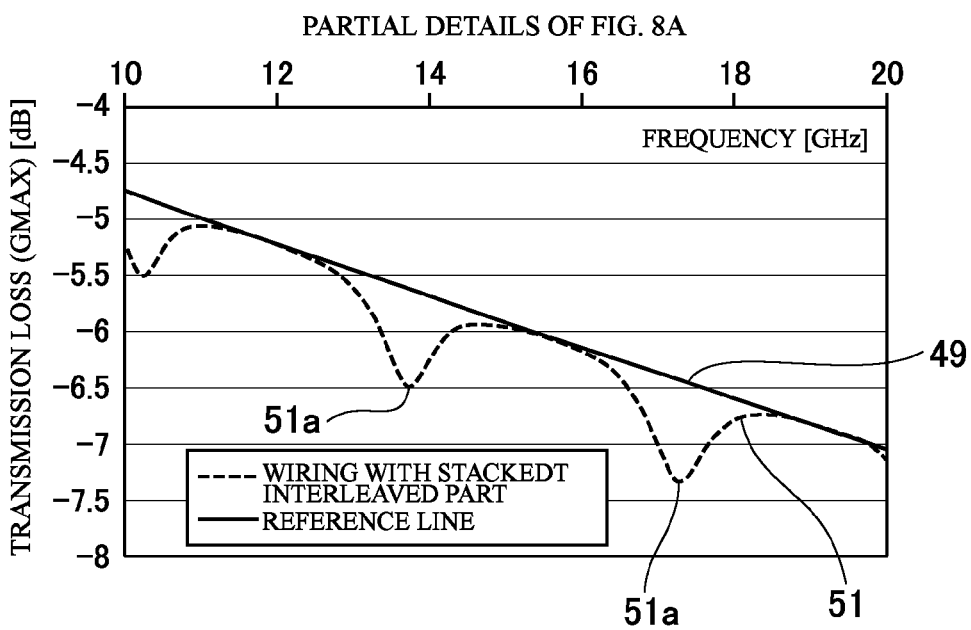

According to the first embodiment, the wiring width of the stacked interleaved part 31 is equal to the wiring width of the write wiring 19a including the wires 27 and 29 as illustrated in FIG. 2. This configuration demonstrates a transmission loss to frequency characteristic illustrated in the graphs of FIGS. 8A and 8B in which FIG. 8A is a general graph and FIG. 8B is an enlarged partial graph of the graph of FIG. 8A. In FIGS. 8A and 8B, an ordinate represents a transmission loss, an abscissa represents a frequency, a characteristic curve 49 represents a standard wiring with wires corresponding to wires 27 and 29 without the stacked interleaved part 31, and a characteristic curve 51 represents the wiring of the first embodiment with the stacked interleaved part 31.

In FIGS. 8A and 8B, the curve 49 of the standard wiring is smooth while the curve 51 of the wiring according to the first embodiment involves transmission loss dips 51a.

The dips 51a function as unintended filters or narrow a bandwidth.

To deal with this problem, the first to third modifications of the first embodiment will be explained with reference to FIGS. 9-14.

Figure 9:
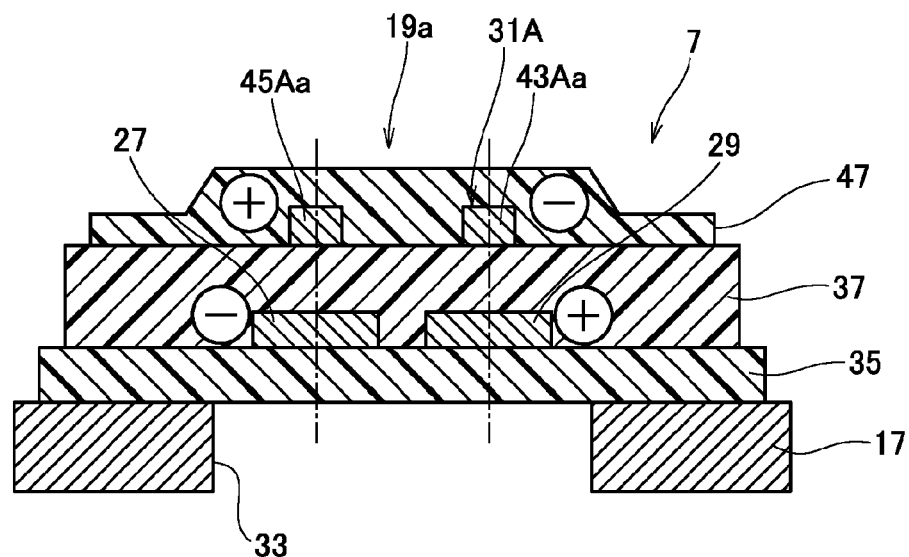
FIG. 9 is a sectional view illustrating a stacked interleaved part of write wiring of a head suspension according to a first modification of the first embodiment of the present invention.
Figure 10:
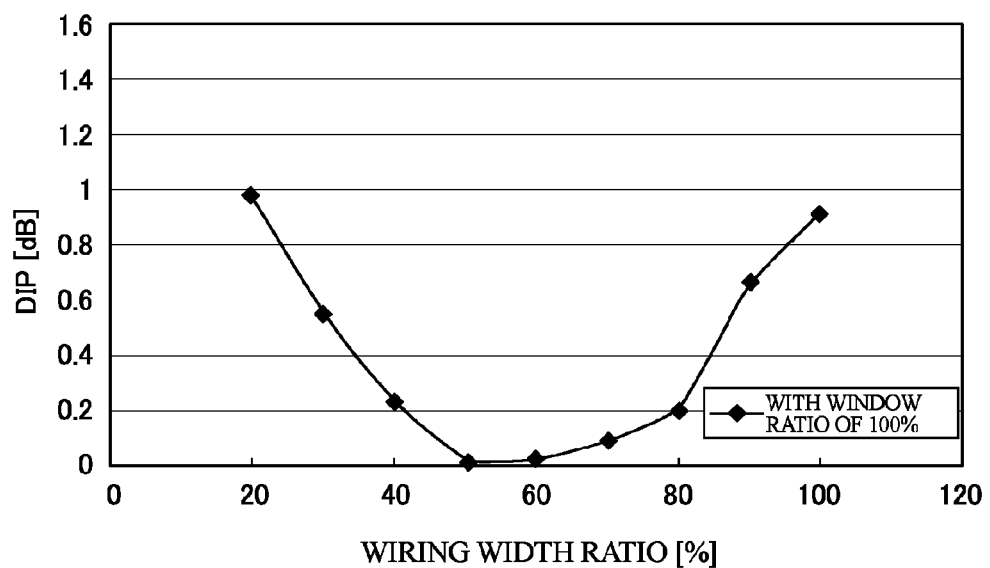
FIG. 10 is a graph illustrating a relationship between a wiring width ratio and a transmission loss dip according to the first modification.

FIG. 9 is a sectional view illustrating a stacked interleaved part of write wiring of a head suspension according to the first modification of the first embodiment of the present invention and FIG. 10 is a graph illustrating a relationship between a wiring width ratio and a transmission loss dip according to the first modification of the first embodiment.

Figure 11:
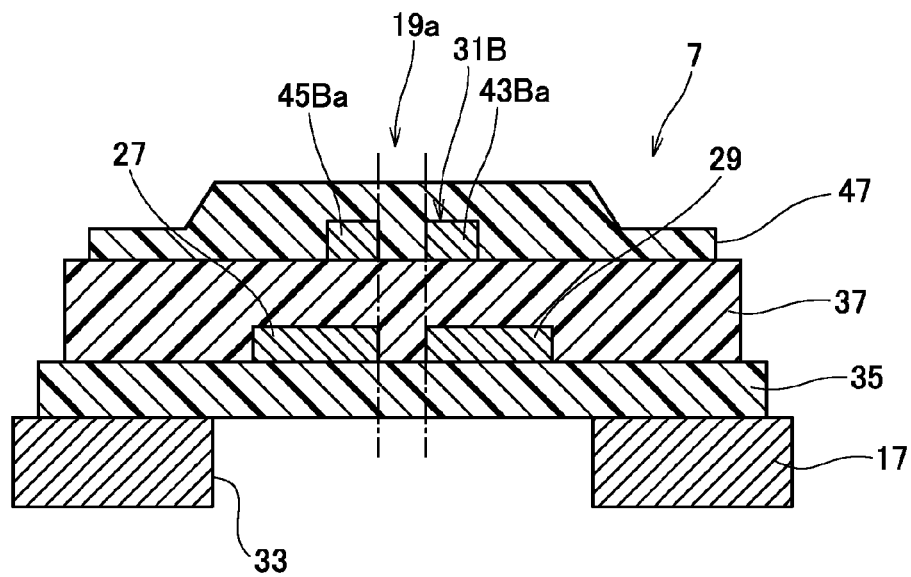
FIG. 11 is a sectional view illustrating a stacked interleaved part of write wiring of a head suspension according to a second modification of the first embodiment of the present invention.
Figure 12:
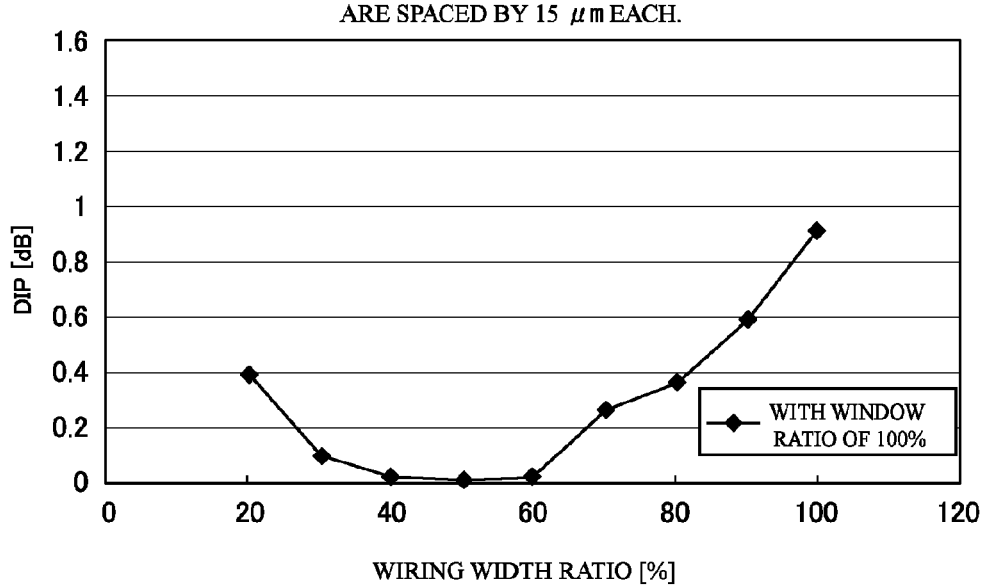
FIG. 12 is a graph illustrating a relationship between a wiring width ratio and a transmission loss dip according to the second modification.

FIG. 11 is a sectional view illustrating a stacked interleaved part of write wiring of a head suspension according to the second modification of the first embodiment of the present invention and FIG. 12 is a graph illustrating a relationship between a wiring width ratio and a transmission loss dip according to the second modification of the first embodiment.

Figure 13:
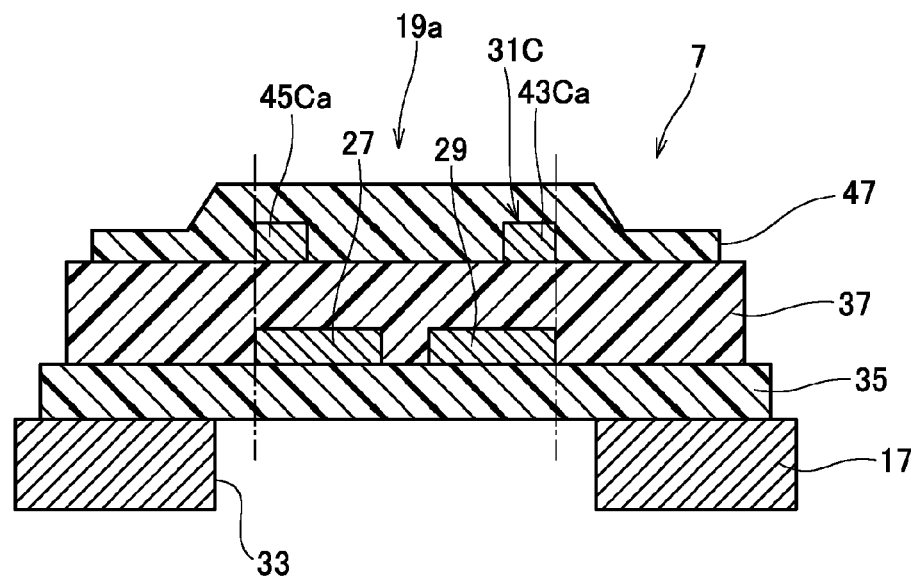
FIG. 13 is a sectional view illustrating a stacked interleaved part of write wiring of a head suspension according to a third modification of the first embodiment of the present invention.
Figure 14:
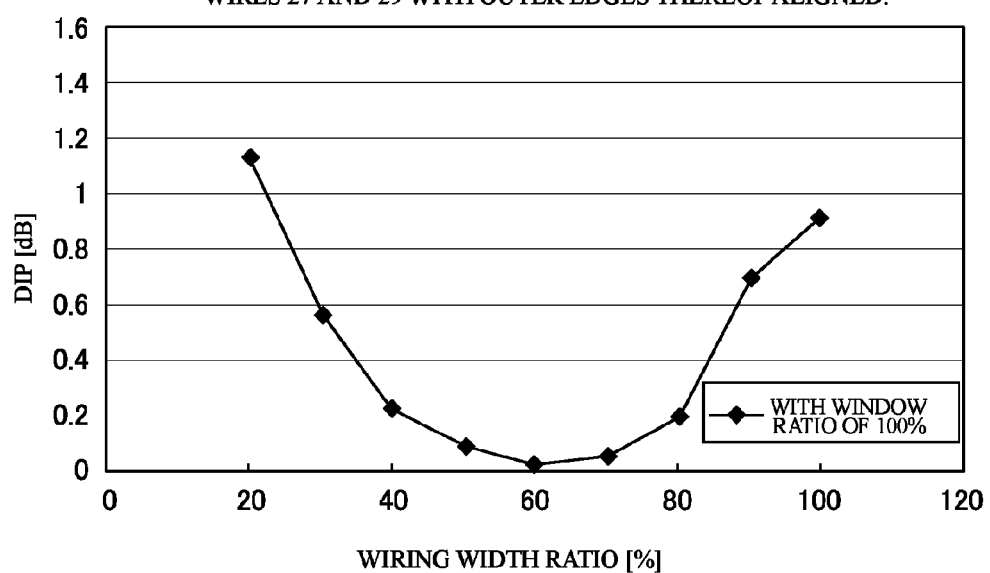
FIG. 14 is a graph illustrating a relationship between a wiring width ratio and a transmission loss dip according to the third modification.

FIG. 13 is a sectional view illustrating a stacked interleaved part of write wiring of a head suspension according to the third modification of the first embodiment of the present invention and FIG. 14 is a graph illustrating a relationship between a wiring width ratio and a transmission loss dip according to the third modification of the first embodiment.

Parts of the first modification illustrated in FIG. 9 corresponding to those of the first embodiment illustrated in FIG. 2 are represented with the same reference marks, or the same reference marks plus "A". Parts of the second modification illustrated in FIG. 11 corresponding to those of FIG. 2 are represented with the same reference marks, or the same reference marks plus "B". Parts of the third modification illustrated in FIG. 13 corresponding to those of FIG. 2 are represented with the same reference marks, or the same reference marks plus "C".

In each of the first to third modifications of FIGS. 9, 11, and 13, an overall wiring width of facing sections 43A$a$ (43B$a$, 43C$a$) and 45A$a$ (45B$a$, 45C$a$) of a stacked interleaved part 31A (31B, 31C) is narrower than an overall wiring width of the wires 27 and 29.

According to the first modification of FIG. 9, the facing sections 43A$a$ and 45A$a$ of the stacked interleaved part 31A are formed on a widthwise center side of the wires 27 and 29.

According to the second modification of FIG. 11, the facing sections 43B$a$ and 45B$a$ of the stacked interleaved part 31B are formed on a widthwise inner side of the wires 27 and 29.

According to the third modification of FIG. 13, the facing sections 43C$a$ and 45C$a$ of the stacked interleaved part 31C are formed on a widthwise outer side of the wires 27 and 29.

The remaining configurations of the first to third modifications are the same as the first embodiment of FIGS. 1 to 3.

A relationship between a wiring width ratio and a transmission loss dip of each modification will be explained with reference to the graphs of FIGS. 10, 12, and 14. In each graph, an ordinate represents a transmission loss dip and an abscissa represents a wiring width ratio. The "wiring width ratio" is the ratio of the overall wiring width of the facing sections 43A$a$ (43B$a$, 43C$a$) and 45A$a$ (45B$a$, 45C$a$) to the overall wiring width of the wires 27 and 29.

It is considered that a transmission loss dip of 0.1 dB or lower is preferable. The first modification of FIGS. 9 and 10 demonstrates a transmission loss dip of 0.1 dB or lower at a wiring width ratio of 45 to 70%, the second modification of FIGS. 11 and 12 at a wiring width ratio of 30 to 65, and the third modification of FIGS. 13 and 14 at a wiring width ratio of 50 to 70%. Accordingly, these wiring width ratios are preferable for the respective modifications.

If a larger transmission loss dip is allowed, the preferable ranges of wiring width ratio will be wider.

Figure 15A:
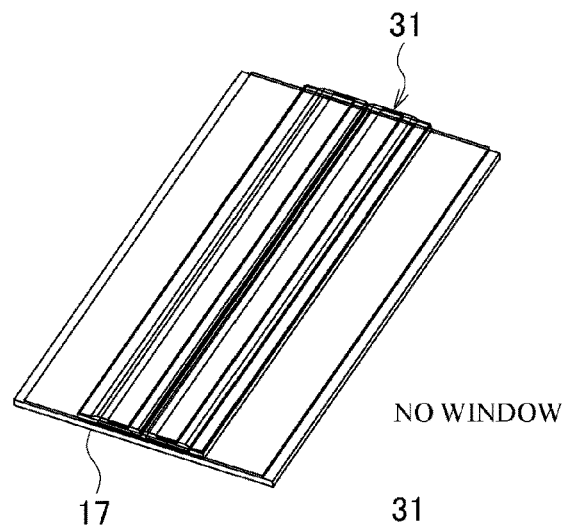
Figure 15B:
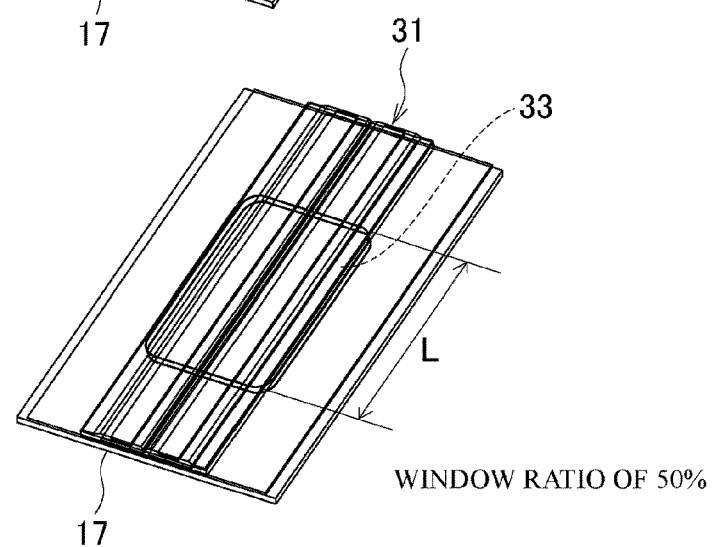
Figure 15C:
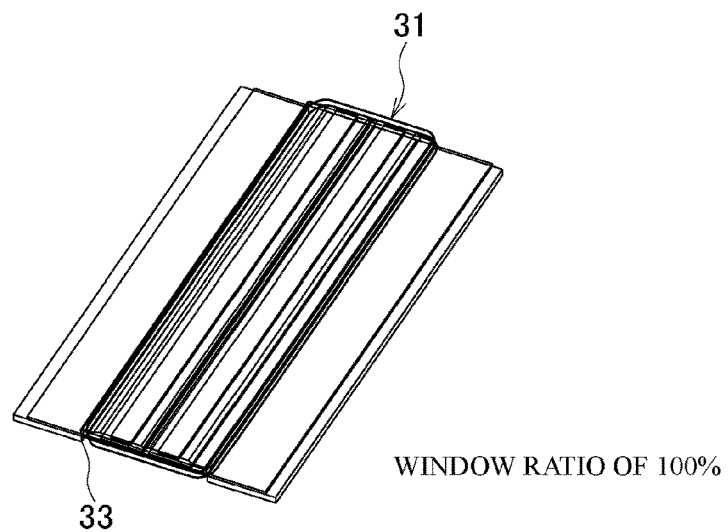

The transmission loss dip is also adjustable by changing an open ratio (window ratio) of the window 33 with respect to the stacked interleaved part 31. FIGS. 15A to 15C are perspective views illustrating the presence or absence of the window 33 provided for the wiring structure according to the first embodiment of the present invention, in which FIG. 15A is with no window, FIG. 15B is with a window of 50% in open ratio, and FIG. 15C is with a window of 100% in open ratio.

Figure 16:
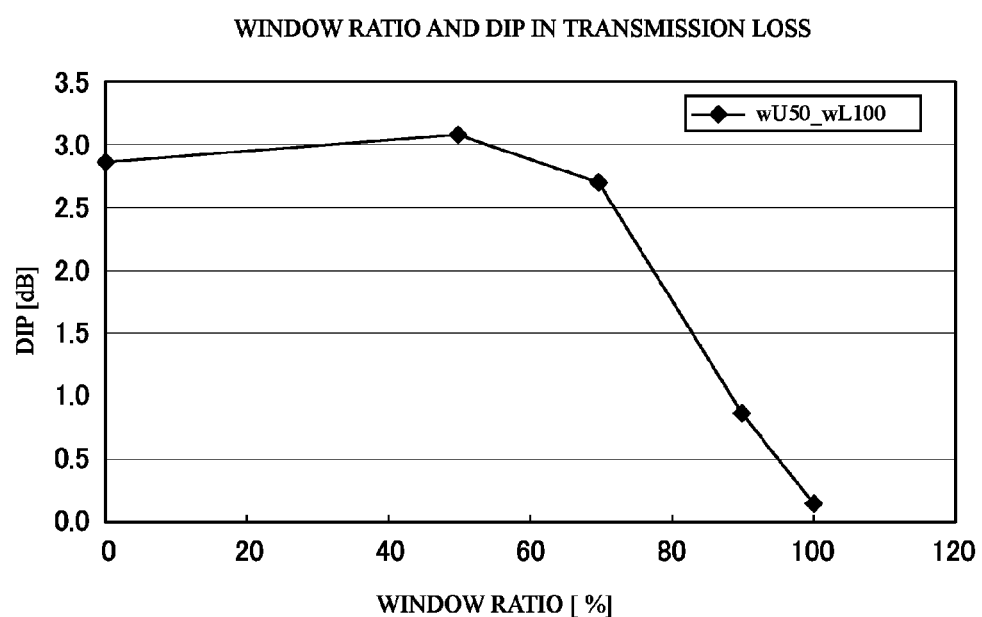
FIG. 16 is a graph illustrating a relationship between a window ratio and a transmission loss dip according to the first embodiment.

FIG. 16 is a graph illustrating a relationship between a window ratio and a transmission loss dip.

As illustrated in FIG. 16, the window ratio of 100% demonstrates a minimum transmission loss dip. It is preferable to select a window ratio according to required characteristics.

The first to third modifications of the first embodiment differently arrange the facing sections 43A$a$ (43B$a$, 43C$a$) and 45A$a$ (45B$a$, 45C$a$) with respect to the wires 27 and 29, and accordingly, demonstrate different bandwidths.

Figure 17:
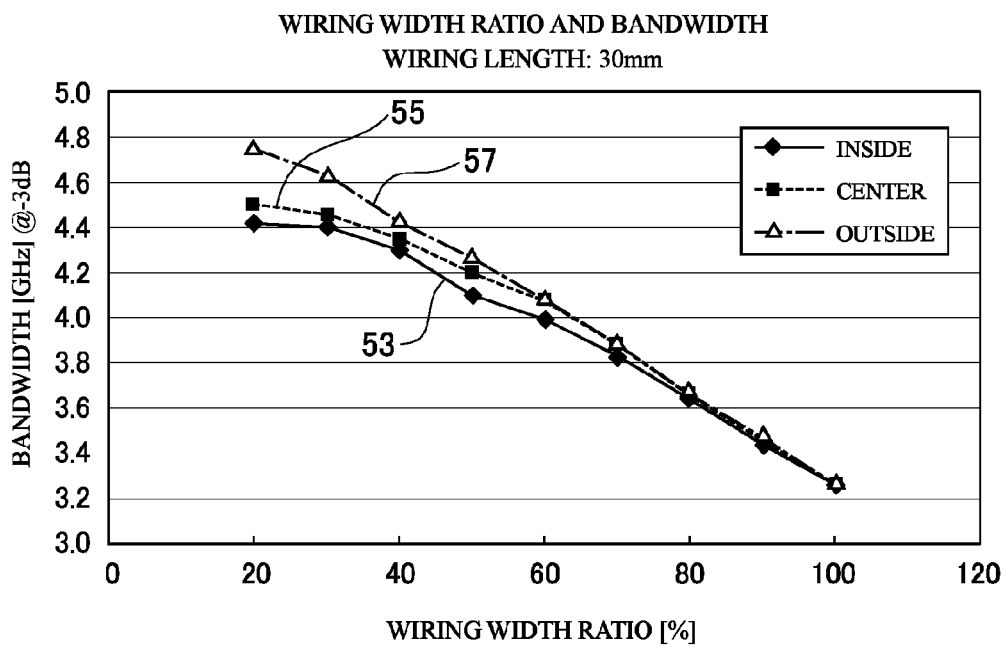
FIG. 17 is a graph illustrating a relationship between a wiring width ratio and a bandwidth according to the first embodiment.
Figure 18:
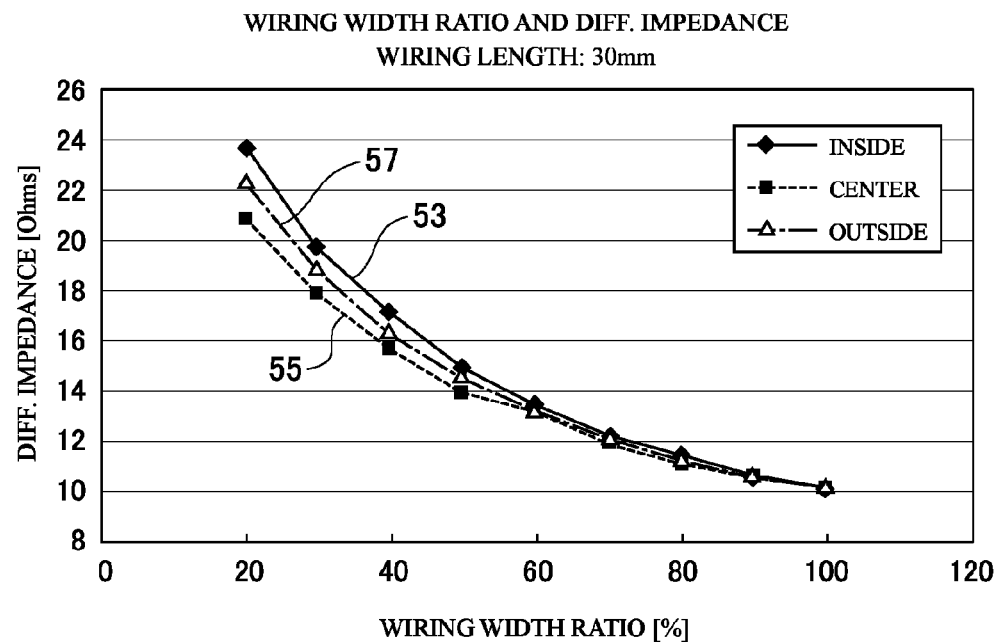
FIG. 18 is a graph illustrating a relationship between a wiring width ratio and an impedance according to the first embodiment.
Figure 19:
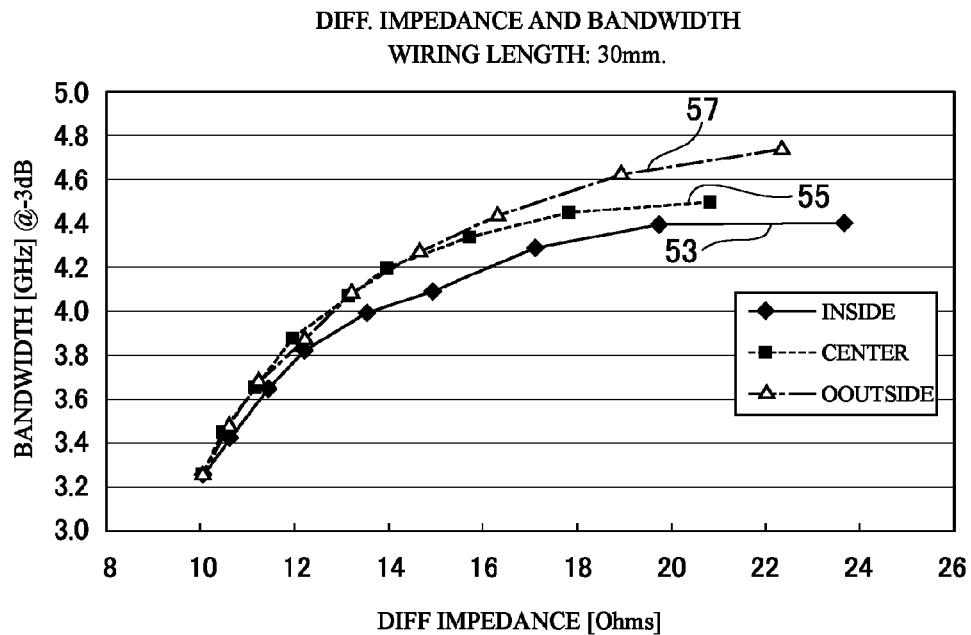
FIG. 19 is a graph illustrating a relationship between an impedance and a bandwidth according to the first embodiment.

FIG. 17 is a graph illustrating a relationship between a wiring width ratio and a bandwidth, FIG. 18 is a graph illustrating a relationship between a wiring width ratio and an impedance, and FIG. 19 is a graph illustrating a relationship between an impedance and a bandwidth. In FIG. 17, an ordinate represents a bandwidth and an abscissa represents a wiring width ratio. In FIG. 18, an ordinate represents an impedance and an abscissa represents a wiring width ratio. In FIG. 19, an ordinate represents a bandwidth and an abscissa represents an impedance.

In connection with the bandwidth of FIG. 17, a characteristic curve 53 of the second modification of FIG. 11 that arranges the facing sections 43B$a$ and 45B$a$ of the stacked interleaved part 31B on the widthwise inner side of the wires 27 and 29 shows a narrowest bandwidth, a characteristic curve 55 of the first modification of FIG. 9 that arranges the facing sections 43A$a$ and 45A$a$ of the stacked interleaved part 31A on the widthwise center side of the wires 27 and 29 shows an intermediate bandwidth, and a characteristic curve 57 of the third modification of FIG. 13 that arranges the facing sections 43C$a$ and 45C$a$ of the stacked interleaved part 31C on the widthwise outer side of the wires 27 and 29 shows a widest bandwidth.

In connection with the impedance of FIG. 18, a characteristic curve 53 of the second modification shows a highest impedance, a characteristic curve 57 of the third modification shows an intermediate impedance, and a characteristic curve 55 of the first modification shows a lowest impedance.

At the same impedance of FIG. 19, a characteristic curve 57 of the third modification shows a widest bandwidth.

Considering an alignment error in wiring, the characteristic curve 55 of the first modification of FIG. 9 that adopts the center side arrangement is most preferable.

According to required characteristics, one of the arrangements of the facing section pairs of 43A$a$ and 45A$a$, 43B$a$ and 45B$a$, and 43C$a$ and 45C$a$ can be selected.

A second embodiment of the present invention will be explained in detail with reference to FIGS. 20-21.

Figure 20:
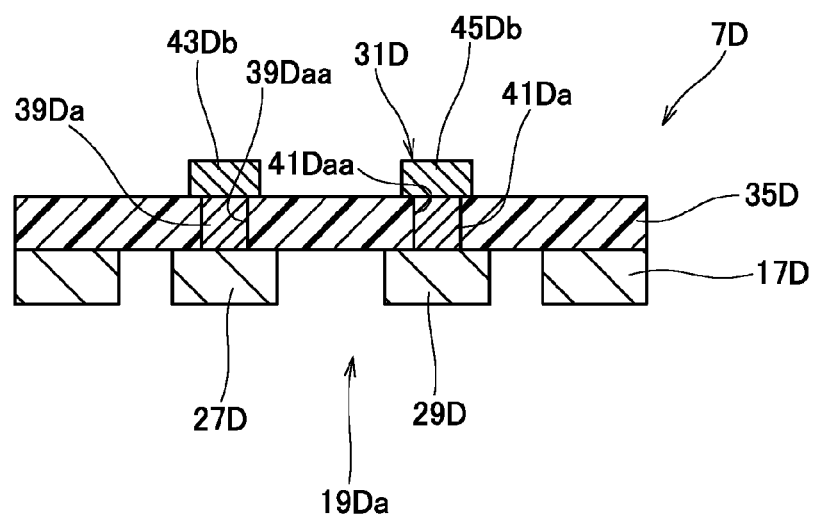
FIG. 20 is a sectional view illustrating a stacked interleaved part provided for write wiring of a head suspension according to a second embodiment of the present invention.
Figure 22:
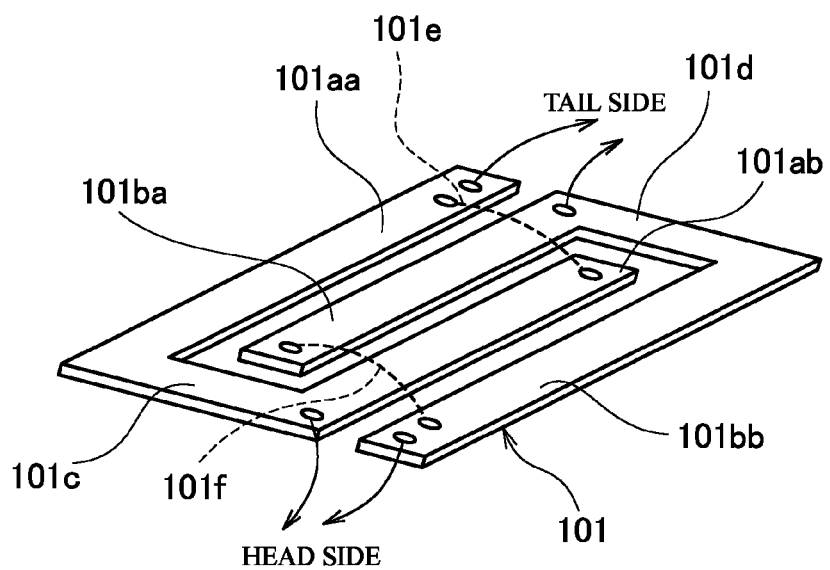
FIG. 22 is a perspective view illustrating a horizontally interleaved wiring structure according to a related art.
Figure 23:
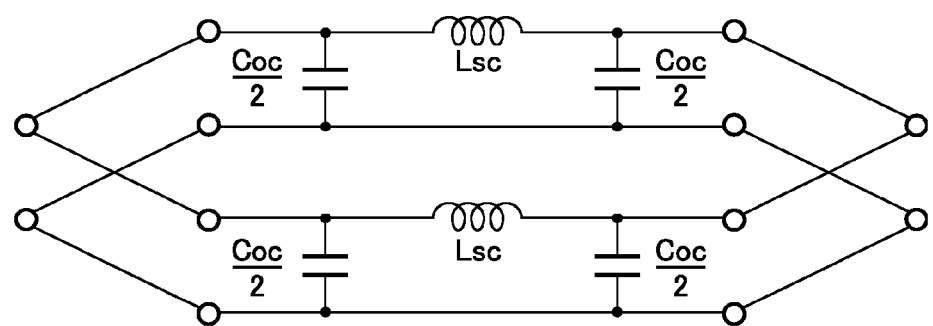
FIG. 23 is a circuit diagram illustrating the related art of FIG. 22.

FIG. 20 is a sectional view illustrating a stacked interleaved part provided for write wiring of a head suspension according to the second embodiment of the present invention. Parts of FIG. 20 corresponding to those of the first embodiment of FIG. 2 are represented with the same reference numerals plus "D".

According to the second embodiment, wires 27D and 29D of opposite polarities of the write wiring 19Da are formed by a part of a conductive thin base material 17D of a flexure 7D.

A base insulating layer 35D is an electrical insulating layer formed on the base material 17D, and on the base insulating layer 35D, the stacked interleaved part 31D is formed. Ends of the stacked interleaved part 31D are electrically connected to the wires 27D and 29D. The stacked interleaved part 31D includes facing sections 43Da and 45Da that face the wires 29D and 27D, respectively, and other elements like the first embodiment.

The second embodiment differs from the first embodiment in that the second embodiment partly uses the base material 17D of the flexure 7D, to form the wires 27D and 29D, omits the intermediate insulating layer 37 of the first embodiment, and forms the stacked interleaved part 31D on the base insulating layer 35D.

The remaining configuration of the second embodiment is the same as the first embodiment illustrated in FIGS. 1 to 3.

The wiring structure according to the second embodiment is manufacturable similar to the first embodiment. Namely, the base insulating layer 35D and conductors 39Da and 41Da are formed on the base material 17D and the stacked interleaved part 31D is formed on the base insulating layer 35D.

The second embodiment provides effects similar to those provided by the first embodiment. The second embodiment omits the intermediate insulating layer 37 of the first embodiment, thereby thinning and simplifying the wiring structure.

FIGS. 21A to 21D are sectional views illustrating a method of manufacturing the wiring structure of FIG. 20, in which FIGS. 21A to 21C are a wiring step and FIG. 21D is a stacked interleaved part forming step. An insulating layer forming step and a cover insulating layer forming step are not illustrated.

Steps S31 to S33 of FIGS. 21A to 21C correspond to the wiring step S1 of FIG. 4A and step S34 of FIG. 21D corresponds to the stacked interleaved part forming step S3 of FIG. 4C.

The wiring step S31 of FIG. 21A forms the wires 27D and 29D from the base material 17D. The wiring step S32 of FIG. 21B forms holes 39Daa, 41Daa, and the like. Although FIG. 21B illustrates only the holes for the conductors 39Da and 41Da, holes for conductors corresponding to the conductors 39b and 41b (FIG. 5B) are also formed. The wiring step S33 of FIG. 21C forms the conductors 39Da, 41Da, and the like by, for example, copper plating.

In this way, the wiring structure manufacturing method according to the second embodiment is carried out like the first embodiment, to form the base insulating layer 35D and conductors 39Da, 41Da, and the like on the base material 17D and the stacked interleaved part 31D on the base insulating layer 35D.

The conductors 39Da, 41Da, and the like may be formed according to any one of the methods illustrated in FIGS. 6A to 6F and 7A to 7D.

If the method of FIGS. 6A to 6F is employed, the step S32 does not form the holes 39Daa, 41Daa, and the like. The step S34 forms the stacked interleaved part 31D (including the crossing sections 43Db and 45Db) by, for example, copper plating. Holes passing through the stacked interleaved part 31D and base insulating layer 35D are formed like the step S14 of FIG. 6D. The conductors 39Da, 41Da, and the like are formed in the holes by, for example, copper plating, to electrically connect the stacked interleaved part 31D to the wires 27D and 29D.

If the method of FIGS. 7A to 7D is employed, the step S32 forms the holes 39Daa, 41Daa, and the like. The step S33 is omitted. The step S34 forms the conductors 39Da, 41Da, and the like together with the stacked interleaved part 31D (including the crossing sections 43Db and 45Db) by, for example, copper plating.

The second embodiment is applicable to form a wiring structure of reversed configuration. Namely, the facing sections 43Da and 45Da and the like of the stacked interleaved part 31D are formed by partly using the base material 17D. The wires 27D and 29D are formed on the base insulating layer 35D by, for example, copper plating. The conductors 39Da, 41Da, and the like are formed as mentioned above.

According to the embodiments, the stacked interleaved part 31 (31A-D) is provided for the write wiring 19a only. However, a stacked interleaved part may be also provided for the read wiring 19b. In this case, the stacked interleaved part for the read wiring is realized by the same structure as that of the write wiring 19a.

What is claimed is:

1. A method of manufacturing a wiring structure of a head suspension including a flexure that supports a head used to write and read data to and from a recording medium and is attached to a load beam applying load onto the head, the wiring structure comprising write wiring and read wiring formed on the flexure and connected to the head, each having wires of opposite polarities and a stacked interleaved part provided at least for the write wiring, the stacked interleaved part including segments electrically connected to the respective wires of the write wiring at both ends in each segment, the segments stacked on and facing the wires of the write wiring through an intermediate insulating layer so that the facing wire and segment have opposite polarities to interleave at least the write wiring at the stacked interleaved part, the method comprising:

a wiring step of forming the wires of the opposite polarities of the write wiring on a base insulating layer and forming a respective wire side-arm branching from each of the wires formed on the base insulating layer;

an insulating layer forming step of forming the intermediate insulating layer on the wires and the wire side-arms and forming the conductors on the wires and the wire side-arms, respectively so that the conductors pass through the intermediate insulating layer and are exposed at a surface of the electrical insulating layer; and a stacked interleaved part forming step of forming segments of opposite polarities of the stacked interleaved part on the electrical insulating layer so that each segment spans between the conductors on the wire side-arm and the wire having a same polarity and electrically connected to said conductors.

2. The method of claim 1, wherein the conductors are formed by copper plating.

* * * * *